United States Patent
Akiya

(10) Patent No.: US 6,236,841 B1
(45) Date of Patent: May 22, 2001

(54) TRANSMISSION OUTPUT POWER CONTROL CIRCUIT FOR CONTROLLING EACH OF ANTENNAS TO OPTIMAL STATES

(75) Inventor: Makoto Akiya, Saitama (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/177,003

(22) Filed: Oct. 22, 1998

(30) Foreign Application Priority Data

Oct. 28, 1997 (JP) .................................................. 9-295303

(51) Int. Cl.[7] .............................. H04B 1/02; H04B 7/02; H04B 1/04; H03C 7/02; H03C 3/00
(52) U.S. Cl. .............................. 455/91; 455/91; 455/101; 455/115; 455/126; 455/129
(58) Field of Search ..................................... 455/103, 104, 455/115, 126, 128, 129, 91, 101, 159

(56) References Cited

U.S. PATENT DOCUMENTS

| | | | |
|---|---|---|---|
| 5,515,008 | * 5/1996 | Ueda et al. ............................ | 330/280 |
| 5,566,363 | * 10/1996 | Senda ..................................... | 455/126 |
| 5,606,285 | * 2/1997 | Wang et al. ........................... | 330/134 |
| 5,659,582 | * 8/1997 | Kojima et al. ........................ | 375/345 |
| 5,752,171 | * 5/1998 | Akiya .................................... | 455/126 |

FOREIGN PATENT DOCUMENTS

| | | | |
|---|---|---|---|
| 2 313 263 | 11/1997 | (GB) | ............................. H04B/7/005 |
| 358190106A | * 11/1988 | (JP) | ................................. H03G/3/20 |
| 363268321A | * 11/1988 | (JP) | ............................. H04B/7/005 |
| 3-154430 | 7/1991 | (JP) | ................................. H04B/1/04 |
| 406037682A | * 2/1994 | (JP) | ............................. H04B/7/005 |
| 9-23176 | 1/1997 | (JP) | ................................. H04B/7/06 |

* cited by examiner

Primary Examiner—Daniel Hunter
Assistant Examiner—Meless Zewdun
(74) Attorney, Agent, or Firm—Scully, Scott, Murphy & Presser

(57) ABSTRACT

A transmission power control circuit includes a plurality of antennas, a plurality of reference voltages provided for the plurality of antennas, respectively, and an amplifier section for amplifying a transmission signal to produce a transmission output signal. A first switch selects one of the plurality of antennas in response to a switch control signal such that the transmission output signal is outputted from the selected antenna. A detecting unit detects a detection voltage for the transmission output signal. A second switch selects one of the plurality of reference voltages in response to the switch control signal. An error correction circuit controls the amplifier section based on the detection voltage and the selected reference voltage such that the transmission output signal has a predetermined power level.

9 Claims, 4 Drawing Sheets

TRANSMISSION OUTPUT POWER CONTROL CIRCUIT FOR CONTROLLING EACH OF ANTENNAS TO OPTIMAL STATES

BACKGROUND OF THE INVENTION

1. Field of the Invention

The present invention relates to a mobile communication apparatus and a transmission output power control circuit of the mobile communication apparatus. More particularly, the present invention relates to a mobile communication apparatus for sending out transmission outputs from a plurality of antennas and a transmission output power control circuit of the mobile communication apparatus.

2. Description of the Related Art

In a conventional technique, a high frequency output power can be varied based on the state of an antenna. A transmission output power control circuit of a mobile communication apparatus for a plurality of antennas is shown in FIG. 1.

Referring to FIG. 1, the transmission output power control circuit is composed of a variable attenuator a, a final stage amplifier b, a detecting circuit c, a switch d an antenna A e, and an antenna B f, an APC (automatic power control) processing section g, and a single reference voltage j. The variable attenuator a attenuates a high frequency input signal based on a direct current voltage inputted thereto. The final stage amplifier b amplifies an output power supplied from the variable attenuator a up to a predetermined power level. The detecting circuit c detects the power outputted from the final stage amplifier b and then converts into a direct current detection voltage by a diode m. The switch d selects one of antenna A and antenna B of a system on the basis of a signal supplied to a selection terminal. The antenna A e and antenna B f output the transmission output power of the predetermined level. The APC (automatic power control) processing section g has a single reference voltage j corresponding to the transmission output power level. The APC processing section g compares the direct current detection voltage obtained by the detecting circuit c with the reference voltage j and outputs a direct current voltage to keep the transmission output power level of constant.

Since the transmission output power control circuit has only one reference voltage j, a difference between a loss in a path from the detecting circuit c to the antenna A e and a loss in a path from the detecting circuit c to the antenna B f can not be detected. For this reason, difference of the transmission power between the antennas becomes large.

A diversity apparatus is described in Japanese Laid Open Patent Application (JP-A-Heisei 9-23176). FIG. 2 shows the circuit structure of the diversity apparatus which removes the difference of the transmission power between the antennas shown in FIG. 1.

Referring to FIG. 2, the diversity apparatus in this conventional technique is composed of a variable attenuator a', a final stage amplifier b', a switch d', detecting circuits c' and c", an antenna A e' and an antenna B f', a switch h', an APC processing section g', and reference voltages j' and k'.

The variable attenuator a' can attenuates a high frequency output power on the basis of a direct current voltage. The final stage amplifier b' amplifies the high frequency output power from the variable attenuator a' up to a predetermined power level. The switch d' selects one of antennas of an antenna A/B system on the basis of a selection signal. The detecting circuits c' and c" detect the transmission output power level in the respective antennas and then converting into the direct current voltages by diodes m' and m", respectively. The antenna A e' and antenna B f' output the transmission output powers of the predetermined levels. The switch h' selects one of the detected voltages for the antenna A e' and the antenna B f' obtained by the detecting circuits c' and c" on the basis of the selection signal. The APC processing section g' has the reference voltages j' and k' for the number of antennas (two, in FIG. 2). The APC processing section g' outputs the direct current voltage to keep the transmission output power constant. This circuit structure requires the reference voltages j' and k' and the detecting circuits c' and c" for the number of antennas.

In such a diversity apparatus, reception electric field levels are detected from signals received by the antennas A and B and an antenna indicative of the maximum reception electric field level is selected, when the antenna A e' and the antenna B f' are spaced from each other in distance. A switch signal is supplied to an antenna system A/B selection terminal and used to select one of the antennas A and B.

For example, when the antenna A e' is selected, the switch d' is set to an upper side in FIG. 2. The detection voltage obtained from the detecting circuit c' is applied to a non-inversion terminal of the APC processing section g' and then compared with the reference voltage j'. The voltage of the compared result is sent to the variable attenuator a'. Accordingly, the attenuation amount of the variable attenuator a' is adjusted such that the transmission output power from the antenna A e' is set to the predetermined level. When the transmission output power is outputted from the antenna B f', the similar operations are performed. The attenuation amount of the variable attenuator a' is adjusted in such a process on the basis of the predetermined reference voltages j' and k'. Then, the output from the variable attenuator a' is amplified by the final stage amplifier b'. Thus, the transmission output powers outputted from the antenna A e' and antenna B f' are controlled to be the predetermined levels. As a result, the difference between the antenna A and the antenna B in output power can be made small.

Also, an automatic transmission power control apparatus is described in Japanese Laid Open Patent Application (JP-A-Heisei 3-154430). In this reference, the automatic transmission power control apparatus is composed of a transmission power amplifier 4 including a variable attenuator 2 and a power amplifier 3. band pass filters 15 and 16, a transmission antenna 6, a level detector 17, an error amplifier 11 including reference voltages V1 to Vn, a differential amplifier 8, and a loop filter 10. A monitor signal component level of an output signal from the transmission power amplifier 4 is detected and converted into a detection voltage by the level detector 17. The gain of the transmission power amplifier 4 is controlled based on the detection voltage from the level detector 17.

However, the first problem of this diversity apparatus is in that the difference between the power loss from the detecting circuit c to the antenna A e and the power loss from the detecting circuit c to the antenna B e can not be detected in FIG. 1. Therefore, the difference of the transmission output between the antennas becomes large because of the difference between the transmission losses from the detecting circuit c to the antenna terminals in the conventional technique (FIG. 1).

Also, the second problem is in that the detecting circuit must be provided for each of the antennas in FIG. 2. For this reason, the circuit becomes large in size and complex as compared with the case of FIG. 1. As a result, the apparatus cannot be made small in size.

SUMMARY OF THE INVENTION

The present invention is accomplished in the above problems. Therefore, an object of the present invention is to provide a method of controlling a transmission output power to minimize a difference between antennas in a transmission output power level and a transmission output power control circuit for the method with a simple circuit structure.

In order to achieve an aspect of the present invention, a transmission power control circuit includes a plurality of antennas, a plurality of reference voltages provided for the plurality of antennas, respectively, and an amplifier section for amplifying a transmission signal to produce a transmission output signal. A first switch selects one of the plurality of antennas in response to a switch control signal such that the transmission output signal is outputted from the selected antenna. A detecting unit detects a detection voltage for the transmission output signal. A second switch selects one of the plurality of reference voltages in response to the switch control signal. An error correction circuit controls the amplifier section based on the detection voltage and the selected reference voltage such that the transmission output signal has a predetermined power level.

The error correction circuit generates an attenuation control signal based on the detection voltage and the selected reference voltage, and the detecting unit outputs the detection voltage from a signal corresponding to the transmission output signal. In this case, the amplifier section includes a variable attenuator for attenuating the transmission signal based on the attenuation control signal to produce an attenuated transmission signal, an amplifier for amplifying the attenuated transmission signal to produce the transmission output signal, and a directional coupler for generating the signal corresponding to the transmission output signal.

Also, the error correction circuit includes an automatic power control processing section for generating a comparison voltage from the detection voltage, and an operation amplifier for controlling the amplifier section based on the comparison voltage and the selected reference voltage. In this case, the automatic power control processing section includes a comparator for comparing the detection voltage and a detection reference voltage to produce a counter control signal, and a counter section for increasing or decreasing a data indicating the detection reference voltage based on the counter control signal to produce the comparison voltage.

In order to achieve another aspect of the present invention, a method of controlling transmission output signal power, includes the steps of:

attenuating a transmission signal in response to an attenuation control signal to produce an attenuated transmission signal;

amplifying the attenuated transmission signal to produce a transmission output signal;

selecting one of a plurality of antennas in response to a switch control signal by a first switch such that the transmission output signal is outputted from the selected antenna;

detecting a detection voltage for the transmission output signal before the transmission output signal is supplied to the first switch;

selecting one of a plurality of reference voltages in response to the switch control signal; and generating the attenuation control signal based on the detection voltage and the selected reference voltage, such that the transmission output signal has a predetermined power level.

In the generating step, a comparison voltage is generated from the detection voltage, and the attenuation control signal is generated based on the comparison voltage and the selected reference voltage. In this case, when a comparison voltage is generated, the detection voltage and a detection reference voltage are compared to produce a counter control signal, and a data indicating the detection reference voltage is increased or decreased based on the counter control signal to produce the comparison voltage.

In order to achieve still another aspect of the present invention, a transmission power control circuit includes a plurality of antennas, a plurality of reference voltages provided for the plurality of antennas, respectively, and an amplifier section for amplifying a transmission signal to produce a transmission output signal. A first switch selects one of the plurality of antennas in response to a switch control signal. A reception detecting unit detects a strongest one of reception electric field strengths of signals received by the plurality of antennas. A second switch is provided between the first switch and the plurality of antenna, and connects the transmission output signal to the selected antenna in a transmission mode and connects the plurality of antennas to the reception detecting unit in a reception mode. A mode control circuit sets one of the transmission mode and the reception mode. A switch control section generates the switch control signal based on the strongest reception electric field strength. A detecting unit detects a detection voltage for the transmission output signal. A third switch selects one of the plurality of reference voltages in response to the switch control signal. An error correction circuit controls the amplifier section based on the detection voltage and the selected reference voltage such that the transmission output signal has a predetermined power level.

DESCRIPTION OF THE PREFERRED EMBODIMENTS

The transmission output power control circuit of the present invention will be described below in detail with reference to the attached drawings.

Figure 1:
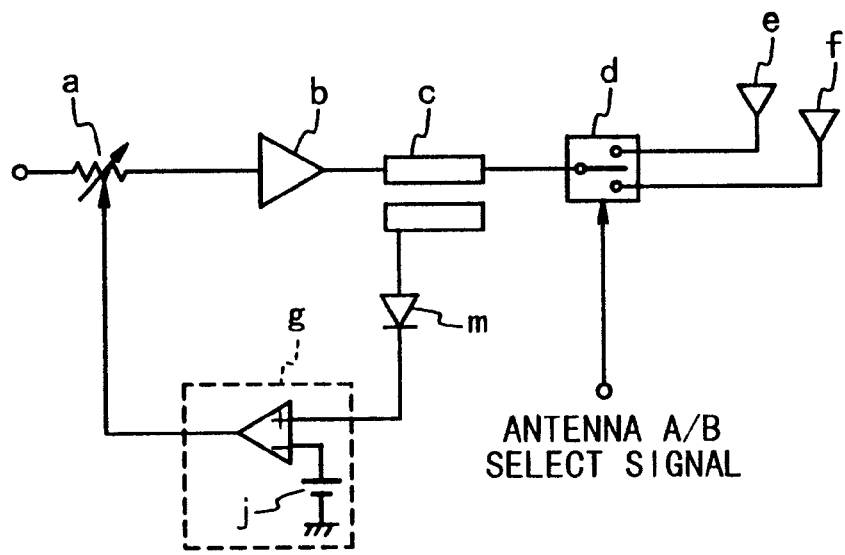
FIG. 1 is a block diagram illustrating the structure of a transmission output power control circuit of a first conventional example.
Figure 2:
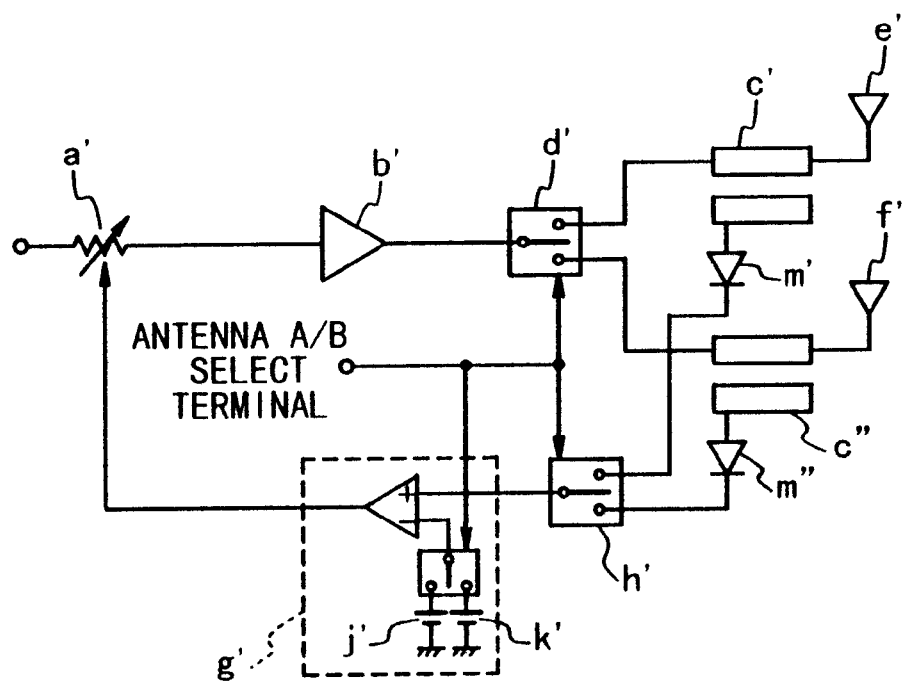
FIG. 2 is a block diagram illustrating the structure of the transmission output power control circuit of a second conventional example.
Figure 3:
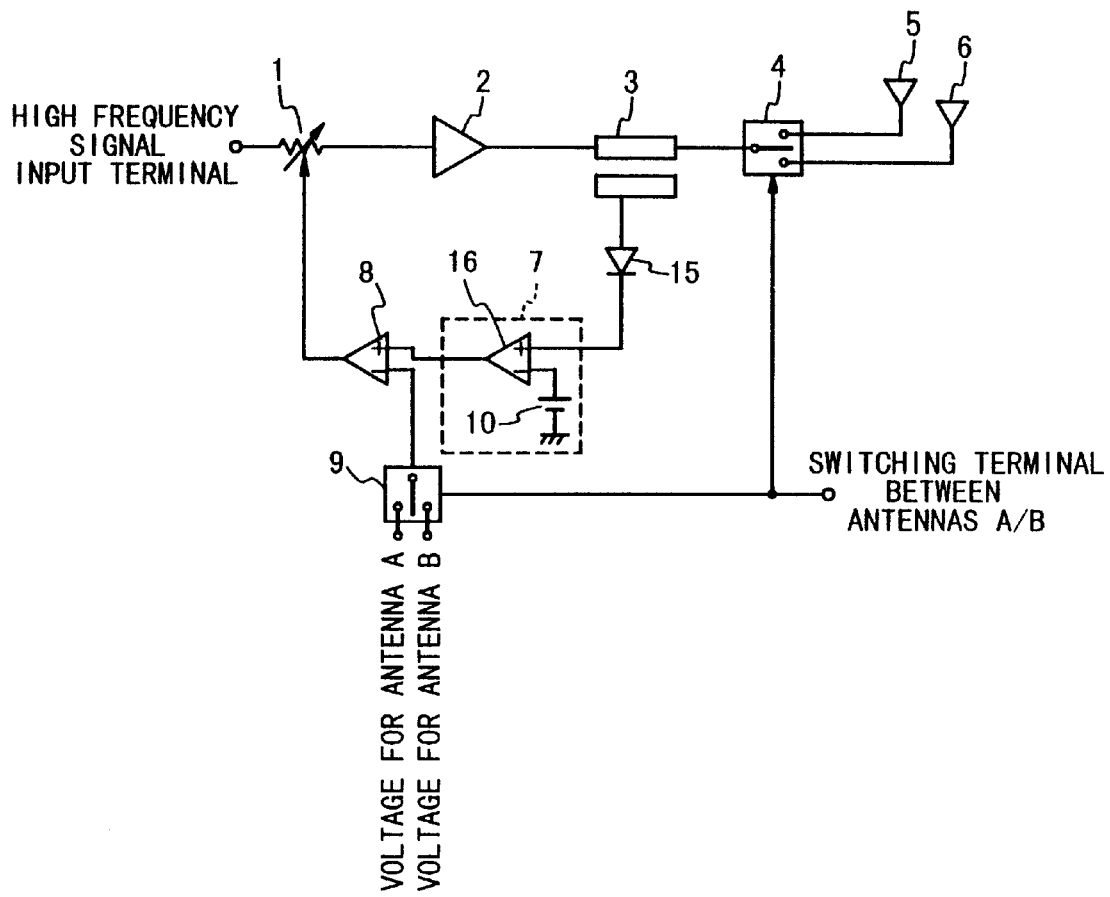
FIG. 3 is a block diagram illustrating the structure of a transmission output power control circuit according to a first embodiment of the present invention.

First, the transmission output power control circuit according to the first embodiment of the present invention will be described below. FIG. 3 is the block diagram illustrating the structure of the transmission output power control circuit according to the first embodiment of the present invention.

Referring to FIG. 3, the transmission output power control circuit of a mobile communication apparatus according to the first embodiment of the present invention is composed of a variable attenuator 1, a final stage amplifier 2, a detecting circuit 3, a switch 4, an antenna A5 and an antenna B6, an automatic power control (APC) processing section 7, a differential operation amplifier 8, a switch 9, a reference voltage 10, and a diode 15. An error correction unit is composed of the APC processing section 7 and differential operation amplifier 8, and an amplifier section is composed of the variable attenuator 1 and the amplifier 2.

The variable attenuator 1 is composed of, for example, a pin diode and has a circuit structure of changing a resistance based on the attenuation control signal. The variable attenuator 1 can attenuate a high frequency power inputted from a high frequency input terminal on the basis of a direct current voltage as an attenuation control signal. The final stage amplifier 2 is composed of a GaAs transistor, a power MOSFET, an IGBT and the like and has a circuit structure of generating a high power output. The final stage amplifier 2 amplifies the high frequency power up to a predetermined power level to produce a transmission output power.

The detecting circuit 3 is composed of, for example, a directional coupler and the like and has a circuit structure of detecting a level voltage having a target frequency with a spurious indicator. The detecting circuit 3 detects the transmission output power amplified by the final stage amplifier 2 and then converting into the direct current voltage by the diode 15 as a detection voltage.

The switch 4 is composed of an MOS switch, a GaAs switch and a PIN diode switch which can endure the high frequency power. The switch 4 selects one of antennas A5 and B6 of an antenna A/B system in accordance with an antenna A/B system switch signal.

The antenna A5 and the antenna B6 desirably has the bar structure as a basic structure, for example, in PHS, to have uniform characteristics in all azimuths. However, the antenna A5 and the antenna B6 may have a tilt function and a diversity function based on an installed location. The antenna AS and the antenna B6 may be a print antenna. The antenna A5 and antenna B6 outputs the transmission output powers.

The APC processing section 7 outputs a comparison voltage on the basis of a difference between the detection voltage and the reference voltage 10. The switch 9 selects one of the reference voltages for the antennas A5 and B6 in response to the switch signal. The selected reference voltage is supplied to the differential operation amplifier 8. A CMOS analog switch can be used for the switch 9.

The differential operation amplifier 8 adds or subtracts the comparison voltage outputted by the APC processing section 7 to and from the selected reference voltage to produce the attenuation control signal. The differential operation amplifier 8 controls the variable attenuator 1 based on the attenuation control signal such that the transmission output power can be outputted from the antenna A5 or the antenna B6 while the transmission output power is kept to the predetermined power level.

Operations of the transmission output power control circuit according to the first embodiment of the present invention will be detailed below with reference to FIG. 3.

When the transmission output power is outputted from the antenna A5, the direct current voltage is detected as the detection voltage from the level voltage having the target frequency with the spurious indicator by means of the directional coupler in the detecting circuit 3. The detection voltage is outputted to the APC processing section 7 which is composed of a comparator 16 and the reference voltage 10. The APC processing section 7 generates the comparison voltage based on the reference voltage and the detection voltage. The comparison voltage is supplied to a plus terminal as a non-inversion terminal of the differential operation amplifier 8. On the other hand, the switch 9 selects the reference voltage for the antenna A5 in accordance with the antenna A/B switch signal. The selected reference voltage is supplied to a minus terminal as an inversion terminal of the differential operation amplifier 8. The differential operation amplifier 8 generates the attenuation control signal based on the comparison voltage and the selected reference voltage such that the transmission output power is outputted from the antenna A5 while the transmission output power is kept constant.

AT this time, when the voltage detected by the detecting circuit 3 is higher than the reference voltage 10, the comparison voltage of the APC processing section 7 becomes high. As a result, the output voltage of the differential operation amplifier 8 as the attenuation control signal is also high. The attenuation amount of the variable attenuator 1 is increased on the basis of this output voltage. Therefore, the output power of the final stage amplifier 2 becomes also lower. In this way, the transmission output power of the final stage amplifier 2 is kept in the predetermined power level.

Figure 4:
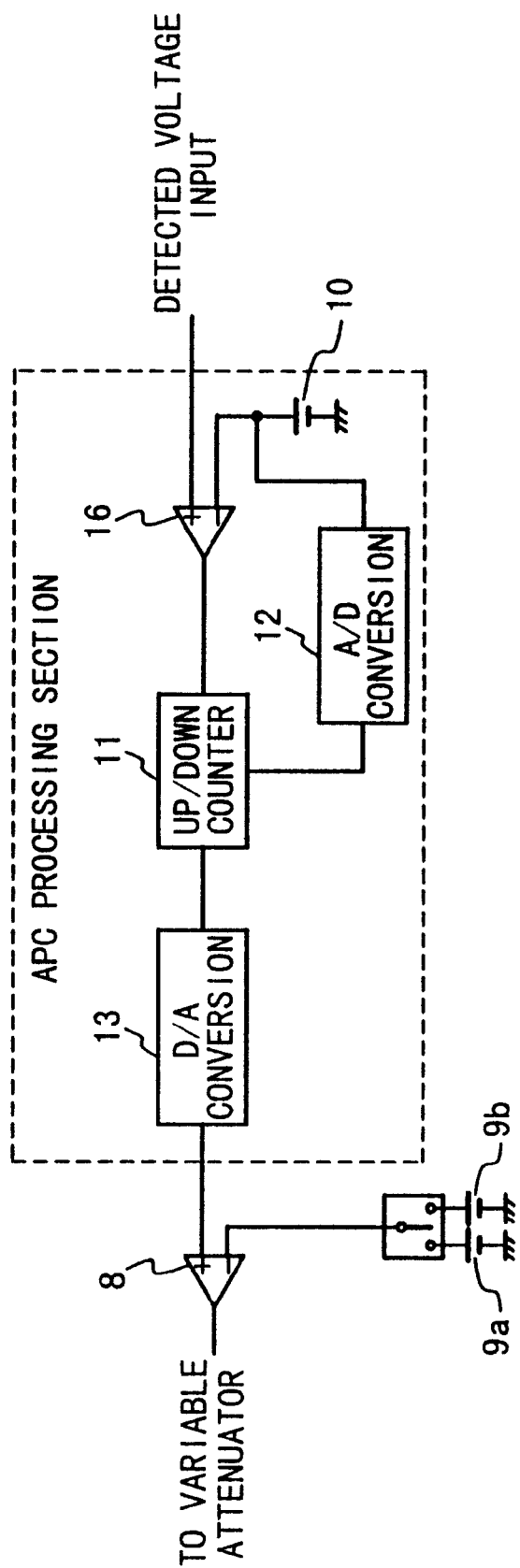
FIG. 4 is a block diagram illustrating the structure of an automatic power control processing section of the transmission output power control circuit according to the first embodiment of the present invention.

The relation between the APC processing section 7 and the differential operation amplifier 8 will be further explained in detail. As shown in FIG. 4, the APC processing section 7 is composed of a comparator 16, the reference voltage 10, an up/down counter 11, an A/D converter 12, and a D/A converter 13 in detail.

The detection voltage of the detecting circuit 3 is supplied to a non-inversion terminal of the comparator 16. The comparator 16 compares the reference voltage 10 supplied to an inversion terminal and the detection voltage to output the comparing result to the up/down counter 11. The A/D converter 12 converts the reference voltage value into a digital value and supplied to the counter 11. The up/down counter 11 can increase or decrease the digital reference voltage value on the basis of the output from the comparator 16. An output from the up/down counter 11 is converted into an analog data by the D/A converter 13 and supplied to the differential operation amplifier 8 as the comparison voltage. The differential operation amplifier 8 compares the comparison voltage with the reference voltage 9a or 9b selected in response to the switch signal, and then controls the variable attenuator 1 on the basis of the compared voltage difference.

When the transmission output power is outputted from the antenna B6, the APC processing section 7 performs the APC process to the detection voltage detected by the detecting circuit 3, similarly to the case of the antenna A5, and then the comparison voltage is outputted. Also, the subsequent processes are the same as in the case that the antenna A5 is selected.

Next, the transmission output power control circuit according to the second embodiment of the present invention will be described below.

Figure 5:
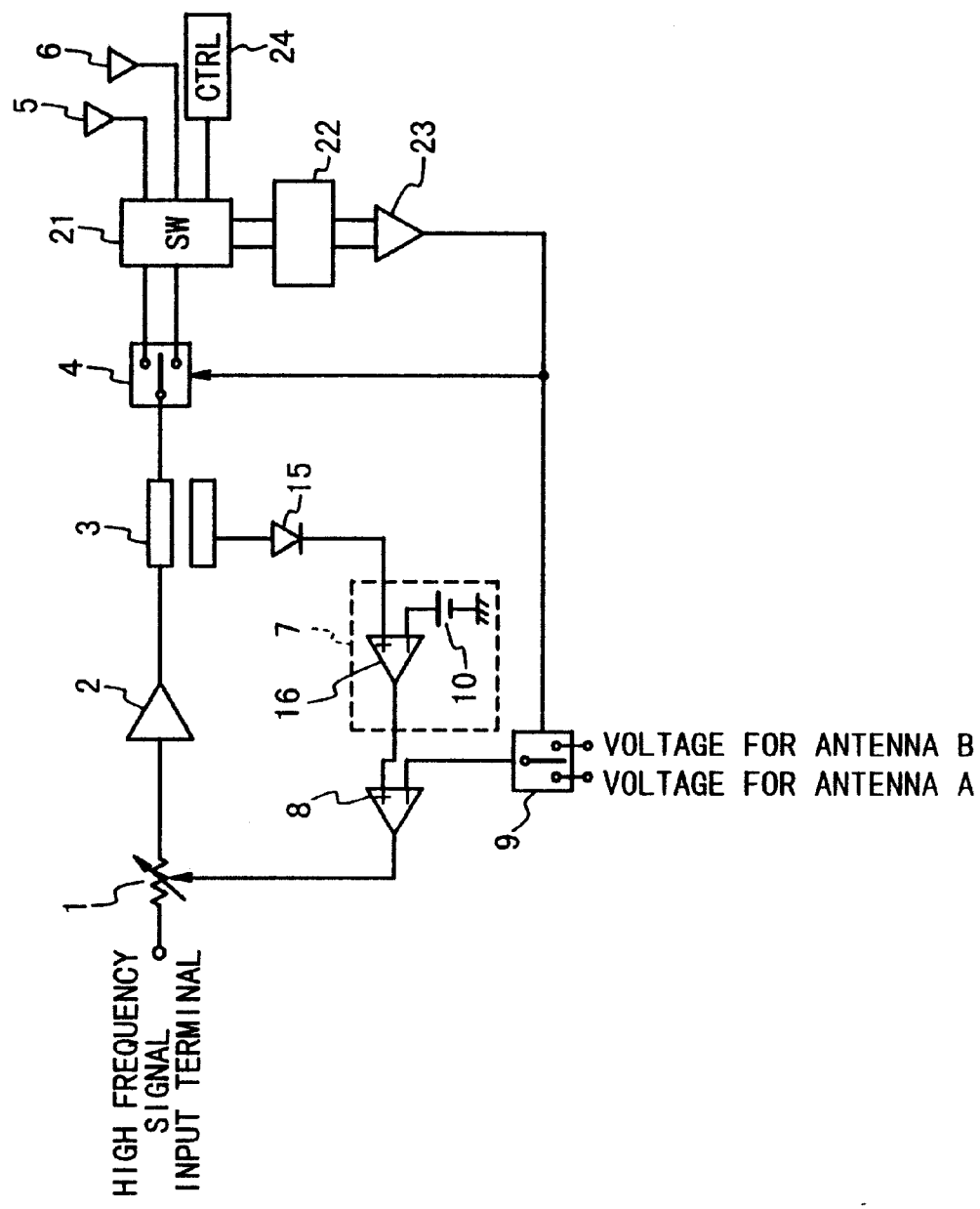
FIG. 5 is a block diagram illustrating the structure of the transmission output power control circuit according to a second embodiment of the present invention.

FIG. 5 is a block diagram illustrating the structure of the transmission output power control circuit according to the second embodiment of the present invention. Referring to FIG. 5, the transmission output power control circuit of a mobile communication apparatus according to the second embodiment of the present invention is composed of the variable attenuator 1, the final stage amplifier 2, the detecting circuit 3, the switch 4, the antenna A5 and the antenna B6, the automatic power control (APC) processing section 7, the differential operation amplifier 8, the switch 9, the reference voltage 10, and the diode 15. The transmission output power control circuit is further composed of a switch 21, a reception electric field level detecting circuit 22, a comparator 23, and a control circuit 24.

The variable attenuator 1, the final stage amplifier 2, the detecting circuit 3, the switch 4, the antenna A5 and the antenna B6, the automatic power control (APC) processing section 7, the differential operation amplifier 8, the switch 9, the reference voltage 10. and the diode 15 are the same as those in the first embodiment.

The switch 21 connects the outputs lines to the antennas A5 and B6 in a transmission mode, respectively. Also, the switch 21 connects the antennas A5 and B6 to the reception electric field level detecting circuit 22 in a reception mode. The comparator 23 compares the reception electric field levels of signals received by the antennas A5 and B6, and outputs the comparing result as the switch signal to the switches 4 and 9. The control circuit 24 generates a mode control signal to output to the switch 21. The control circuit 24 switches the mode control signal based on time slots such that one of the transmission mode and the reception mode is set.

Operations of the transmission output power control circuit according to the second embodiment of the present invention will be detailed below with reference to FIG. 5.

In the reception mode, signals are received by the antennas A5 and B6. The received signals are supplied to the reception electric field level detecting circuit 22. The detecting circuit 22 detects the reception electric field levels of the supplied signals to output to the comparator 23. The comparator 23 selects the strongest one of the detected reception electric field levels and outputs the switch signal corresponding to the strongest reception electric field level. As a result, when the reception electric field level from the antenna A5 is the strongest, the antenna A5 is selected for the transmission antenna based on the switch signal.

When the transmission output power is outputted from the antenna A5, the direct current voltage is detected as the detection voltage by the detecting circuit 3. The detection voltage is outputted to the APC processing section 7 which is composed of a comparator 16 and the reference voltage 10. The APC processing section 7 generates the comparison voltage based on the reference voltage and the detection voltage. The comparison voltage is supplied to the differential operation amplifier 8. On the other hand, the switch 9 selects the reference voltage for the antenna A5 in accordance with the switch signal. The selected reference voltage is supplied to the differential operation amplifier 8. The differential operation amplifier 8 generates the attenuation control signal based on the comparison voltage and the selected reference voltage such that the transmission output power is outputted from the antenna A5 while the transmission output power is kept constant.

The case of the two antennas is explained in the embodiments. However, even the case of three or more antennas can be implemented in a circuit structure. In this case, the minus input side of the differential operation amplifier 8 has the setting voltages corresponding to the number of the antennas. Also, the number of the selection terminal of each of the switch 4 and the switch 9 is equal to or more than 3.

In the embodiment, the transmission output power control circuit for the basic station is mainly explained for the mobile communication apparatus. However, even an automobile portable telephone can attain the similar effect, if having the circuit structure matched to the technical principle of the present invention.

According to the present invention, the loss difference resulting from the system of the antennas is detected as the difference between the detection voltages. The APC processing section and the differential operation amplifier can operate so as to correct the difference between the detection voltages. As a result, the power deviation between the antennas can be minimized in the transmission output power control for a plurality of antennas.

The detector having a single directional coupler can detect the respective transmission output powers to the antennas. Thus, the transmission output power control for the plurality of antennas can be accomplished using the simple circuits. In this way, it is possible to effectively ensure the space diversity effect due to the switching operation between the plurality of antennas.

What is claimed is:

1. A transmission power control circuit comprising:
   a plurality of antennas;
   an amplifier section for amplifying a transmission signal to produce a transmission output signal;
   a first switch for selecting one of said plurality of antennas in response to a switch control signal;
   a reception detecting unit for detecting a strongest one of reception electric field strengths of signals received by said plurality of antennas;
   a second switch provided between said first switch and said plurality of antenna, for connecting said transmission output signal to said selected antenna in a transmission mode and for connecting said plurality of antennas to said reception detecting unit in a reception mode;
   a mode control circuit for setting one of the transmission mode and the reception mode;
   a switch control section for generating said switch control signal based on said strongest reception electric field strength;
   a detecting unit for detecting a detection voltage for said transmission output signal;
   a plurality of reference voltages provided for said plurality of antennas, respectively;
   a third switch for selecting one of said plurality of reference voltages in response to said switch control signal; and
   an error correction circuit for controlling said amplifier section based on said detection voltage and said selected reference voltage such that said transmission output signal has a predetermined power level.

2. A transmission power control circuit according to claim 1, wherein said error correction circuit generates an attenuation control signal based on said detection voltage and said selected reference voltage, and said detecting unit outputs said detection voltage from a signal corresponding to said transmission output signal, and
   wherein said amplifier section comprises:
   a variable attenuator for attenuating said transmission signal based on said attenuation control signal to produce an attenuated transmission signal;
   an amplifier for amplifying said attenuated transmission signal to produce said transmission output signal; and
   a directional coupler for generating the signal corresponding to said transmission output signal.

3. A transmission power control circuit according to claim 1, wherein said error correction circuit comprises:
   an automatic power control processing section for generating a comparison voltage from said detection voltage; and an operation amplifier for controlling said amplifier section based on said comparison voltage and said selected reference voltage.

4. A transmission power control circuit according to claim 3, wherein said automatic power control processing section comprises:

a comparator for comparing said detection voltage and a detection reference voltage to produce a counter control signal; and a counter section for increasing or decreasing a data indicating the detection reference voltage based on the counter control signal to produce said comparison voltage.

5. A transmission power control circuit comprising:

a plurality of antennas;

an amplifying section for amplifying a transmission signal to produce a transmission output signal;

a first switch for selecting one of said plurality of antennas in response to a switch control signal such that said transmission output signal is outputted from said selected antenna;

a detecting unit for detecting a detection voltage for said transmission output signal;

a plurality of reference voltages provided for said plurality of antenna, respectfully;

a second switch for selecting one of said plurality of reference voltages in response to said switch control signal; and an error correction circuit for controlling said amplifier section based on said detection voltage, said reference voltage, such that said transmission output signal has a predetermined power level; and wherein said error correction control circuit comprises:

an automatic power control processing section for generating a comparison voltage; and an operational amplifier for controlling said amplifier section based on said comparison voltage and said selected reference voltage.

6. A transmission power control circuit according to claim 1, wherein said error correction circuit generates an attenuation control signal based on said detection voltage and said selected reference voltage, and said detecting unit outputs said detection voltage from a signal corresponding to said transmission output signal, and wherein said amplifier section comprises:

a variable attenuator for attenuating said transmission signal based on said attenuation control signal to produce an attenuated transmission signal;

an amplifier for amplifying said attenuated transmission signal to produce said transmission output signal; and a directional coupler for generating the signal corresponding to said transmission output signal.

7. A transmission power control circuit according to claim 3, wherein said automatic power control processing section comprises:

a comparator for comparing said detection voltage and a detection reference voltage to produce a counter control signal; and a counter section for increasing or decreasing a data indicating the detection reference voltage based on the counter control signal to produce said comparison voltage.

8. A method of controlling transmission output signal power, comprising the steps of:

attenuating a transmission signal in response to an attenuation control signal to produce an attenuated transmission signal;

amplifying the attenuated transmission signal to produce a transmission output signal;

selecting one of a plurality of antennas in response to a switch control signal by a first switch such that said transmission output signal is outputted from said selected antenna;

detecting a detection voltage for said transmission output signal before said transmission signal is supplied to said first switch;

selecting one of a plurality of reference voltages in response to said switch control signal; and generating said attenuation control signal based on said detection voltage and said selected reference voltage, such that said transmission output signal has a predetermined power level; and wherein said generation step comprises the steps of:

generating a comparison voltage from said detection voltage; and generating said attenuation control signal based upon said comparison voltage and said selected reference voltage.

9. A method according to claim 6, wherein said step of generating a comparison voltage comprises the steps of:

comparing said detection voltage and a detection reference voltage to produce a counter control signal; and increasing or decreasing a data indicating the detection reference voltage based on the counter control signal to produce said comparison voltage.

* * * * *